United States Patent [19]

Shiba et al.

[11] 4,104,785
[45] Aug. 8, 1978

[54] LARGE-SCALE SEMICONDUCTOR INTEGRATED CIRCUIT DEVICE

[75] Inventors: Hiroshi Shiba; Kenji Kani, both of Tokyo, Japan

[73] Assignee: Nippon Electric Co., Ltd., Tokyo, Japan

[21] Appl. No.: 660,426

[22] Filed: Feb. 23, 1976

[30] Foreign Application Priority Data

Feb. 28, 1975 [JP] Japan .................................. 50-25354

[51] Int. Cl.² ............................................. B01J 17/00
[52] U.S. Cl. .................................. 29/574; 29/577 C;
29/589; 29/591; 357/40
[58] Field of Search ................... 29/574, 576 S, 577,
29/588, 589, 591; 357/40

[56] References Cited

U.S. PATENT DOCUMENTS

| 3,707,036 | 12/1972 | Okable | 29/574 |
| 3,900,944 | 8/1975 | Fuller | 29/591 |

*Primary Examiner*—W. Tupman
*Attorney, Agent, or Firm*—Hopgood, Calimafde, Kalil, Blaustein & Lieberman

[57] ABSTRACT

In fabricating a large-scale semiconductor integrated circuit, a wiring layer within each unit cell is formed of a conductive material which is hard and highly resistant to corrosion, and test pads for each unit cell are formed of a conductive material which is soft and low resistant to corrosion. After testing each unit cell by using the test pads, the test pads are etched away. If necessary, pad relocation wiring which is used to substitute a good unit cell for a bad unit cell may be formed of the hard and highly corrosion-resistant conductive material, and an intercell wiring layer may be formed of the soft and low corrosion-resistant conductive material.

20 Claims, 34 Drawing Figures

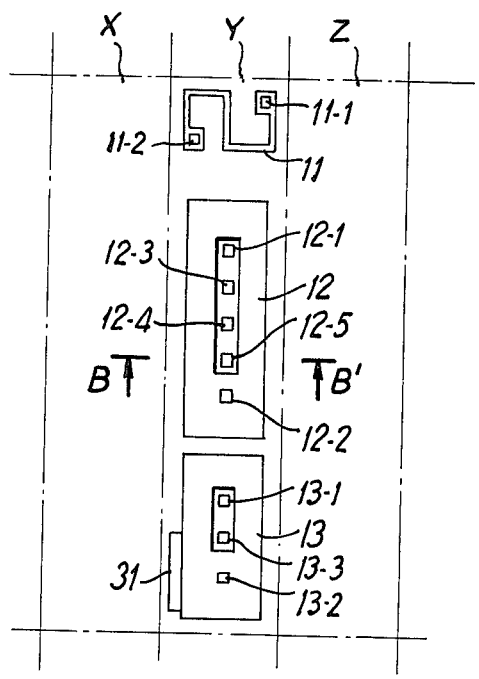
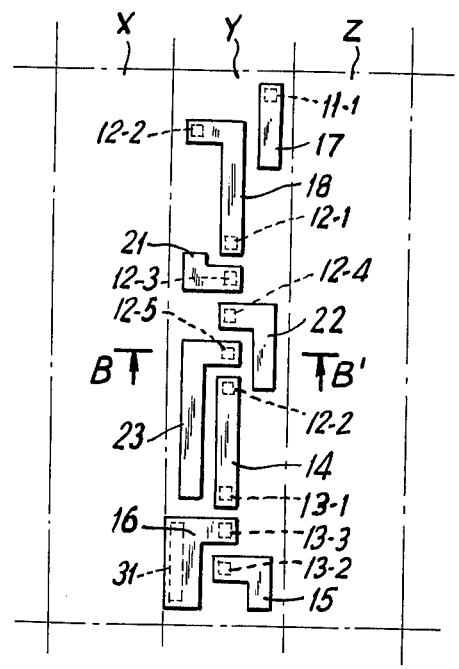
FIG. 3A　　　　　　　　FIG. 4A
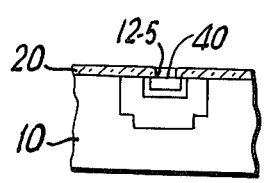
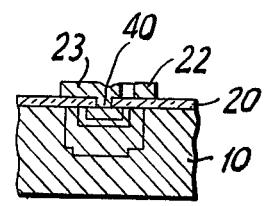
FIG. 3B　　　　　　　　FIG. 4B

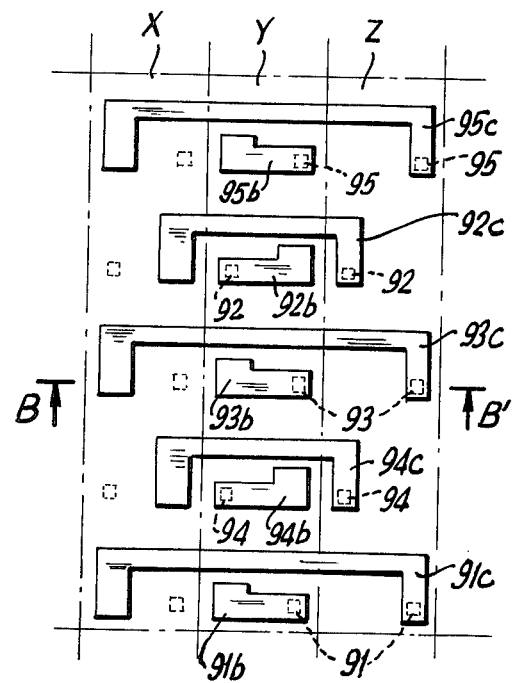
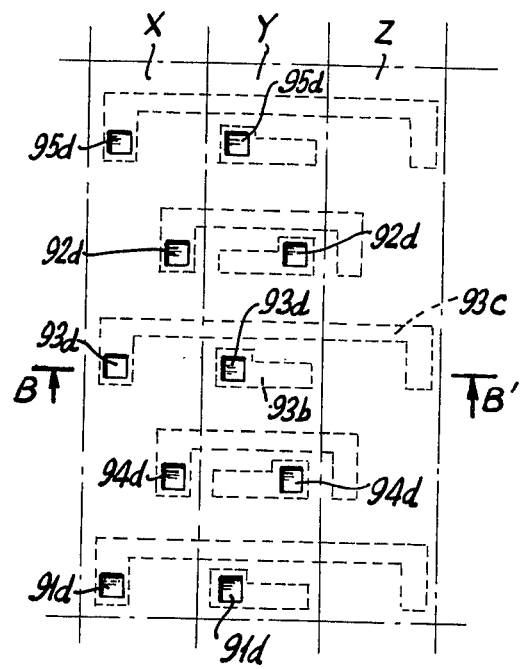
FIG. 7A				FIG. 8A
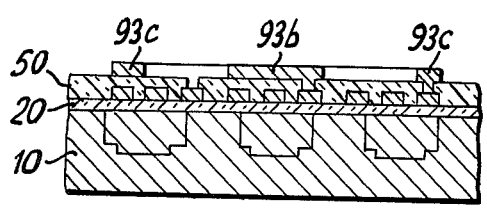
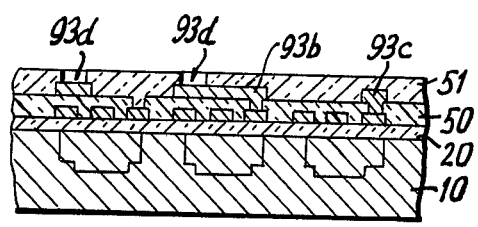
FIG. 7B				FIG. 8B

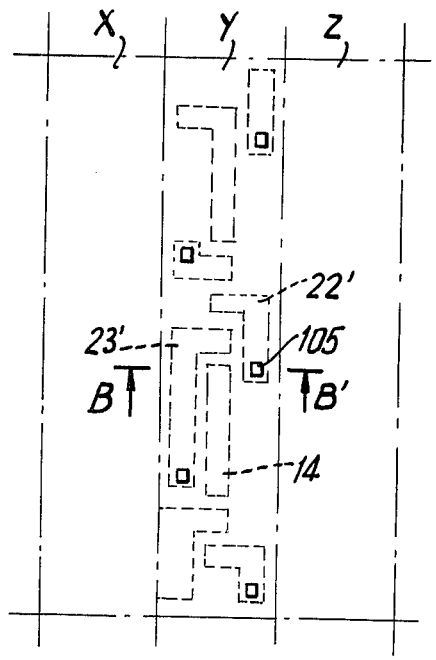
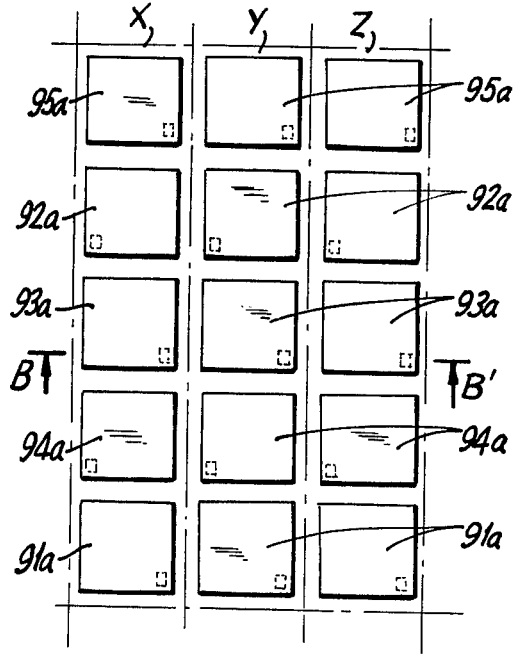
FIG.11A       FIG.12A
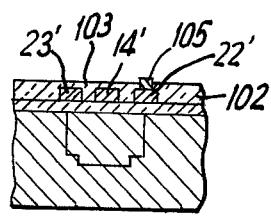
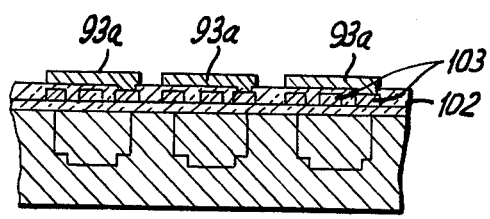
FIG.11B       FIG.12B

LARGE-SCALE SEMICONDUCTOR INTEGRATED CIRCUIT DEVICE

The present invention relates to large-scale semiconductor integrated (heretofore referred to as LSI) circuits, and more particularly to methods for fabricating full-wafer (full-slice) LSI circuits.

The following three techniques have been commonly known to be useful for the fabrication of LSI circuit devices, particularly for interconnecting very large numbers of circuits on integrated-circuit wafers:

(A) Fixed wiring technique
(B) Discretionary wiring technique
(C) Pad relocation technique The technique (A), which is most widely used in LSI circuit fabrication, employs a fixed pattern for interconnecting all the circuit elements contained in each LSI circuit. Because the wiring pattern is fixed, a defect-free LSI circuit is only obtained when all the circuit elements in the LSI circuit are free of defect. To this effect, the yield must be 100% for the circuit elements within an area of the wafer necessary for a LSI circuit to be formed. In practice, the scale of an LSI circuit obtainable with this technique is limited to an area of 5 mm × 5 mm and to only a few thousand gates.

According to the technique (B), as shown in FIG. 1, an LSI circuit is formed through the process of (1) diffusion treatment of a wafer for forming circuit elements therein, (2) first layer wiring for interconnection of circuit elements within each unit cell (e.g. a single gate circuit) by the use of a fixed pattern, (3) examining the electrical characteristics of the individual unit cells following the first layer wiring process, and (4) the second and third layer wirings for interconnection of defect-free unit cells by the use of a unique pattern per wafer according to the positions of the examined defect-free unit cells. This technique is described in detail in "A discretionary wiring system as the interface between design automation and semiconductor array manufacture" by J. W. Lathrop et al., Proceedings of IEEE, Vol. 55, pp. 1988–1997, Nov. 1967. The technique (B) is advantageous in that inter-cell connections can be modified according to the position of defect-free cell on a wafer whereby a full-wafer LSI of a considerably larger scale than that obtainable with the technique (A) is realized even if the yield of circuit elements is not sufficiently high. According to the technique (B), however, the wiring patterns for the second and third layers are intricate. In addition, this technique requires a large number of wiring patterns.

According to the technique (C), as shown in FIG. 2, a full-wafer LSI circuit is formed through the processes of (1) wafer diffusion, (2) wiring for interconnection within unit cell by the use of a fixed pattern, (3) examining electrical characteristics of the individual unit cells, (4) pad relocation wiring for connecting terminals of defective unit cells to good unit cells selected from extra unit cells which have been prepared previously, that is, for replacing the defective unit cells with the good unit cells, by the use of a unique pattern per wafer according to the positions of the defective and good unit cells, and (5) inter-cell wiring by the use of a fixed pattern. This technique is advantageous in that wiring to be modified according to the positions of defective cells is simplified by the use of a minimum number of simple pad-relocation patterns to make it easier to fabricate full-wafer LSI circuits than by the discretionary wiring technique (B). The technique (C) is described in detail in "The pad relocation technique for interconnecting LSI arrays of imperfect yield " by D. F. Calhoun, Proceeding of Fall Joint Computer Conference, 1969, pp. 99–109.

As generally accepted, the smaller the area of a unit cell, the larger is the number of unit cells installable on one wafer and hence the greater will be the yield. With the technique (B) or (C), therefore, the area of a unit cell must be as small as possible. In practice, prior art techniques involve difficulties when test pads are used in the unit cell for examining their electrical characteristics, because the size of the test pads is fairly large, e.g., 50 $\mu$m × 50 $\mu$m and hence makes it impossible to obtain a unit cell of sufficiently small size that is optimum for the manufacture of LSI circuits with high yield.

It is, therefore, an object of the invention to provide a method of fabricating LSI circuit devices, which can use sufficiently small unit cells and examine electrical characteristics of the unit cell, thus permitting an LSI circuit to be formed with good unit cells.

In the fabrication of LSI circuits by the prior technique (B) or (C), it is desired that the yield after the testing process of the unit cells be as high as possible. According to prior art techniques, a wafer which is found to involve defective or erroneous inter-cell wiring must be thrown away.

It is, therefore, another object of the invention ι provide a method of regenerating a wafer having a defective or erroneous inter-cell wiring.

In the fabrication of LSI circuits by the prior technique (B) or (C), it is essential in view of productivity that the number of wiring patterns to be changed by wafers be as small as possible.

It is, therefore, a further object of the invention to provide a method for minimizing the number of wiring patterns needed for LSI wafers.

One feature of the method of the invention for fabricating LSI circuits lies in that test pads are formed on each unit cell separately from the layer of wiring within the unit cell which interconnects the elements of the unit cell or connects the elements to terminals (hereinafter called as "unit cell wiring"). Preferably, the test pads are installed above the layer of the unit cell wiring with an insulating layer interposed therebetween and with electrical contacts connecting the test pads to necessary parts of the unit cell wiring through contact holes formed in the insulating layer. After the unit cell is electrically examined by the use of test probes in contact with the test pads, the test pads are removed from the unit cell.

According to another aspect of the invention, the layer of the unit cell wiring is formed of a first type of conductive material which is hard and highly resistant to corrosion, such as tantalum, tungsten, titanium, platinum or silicon, whereas the test pads and the through-hole electrical contacts to the necessary parts of the unit cell wiring are both formed of a second type of conductive material which is soft and of low corrosion-resistance, such as aluminum. After an electrical test of the unit cell via the test pads, the test pads and the through-hole contacts of the second type of conductive material are readily etched away by an etching solution which cannot or can hardly etch the first type conductive material but can easily etch the second type conductive material. The unit cell wiring of the first type conductive material is retained non-attacked during the etching of the test pads and through-hole contacts. Thereafter, a layer of the inter-cell wiring by a discretionary pattern according to the technique (B) or a layer of the pad-relocation wiring according to the technique (C) may be formed on the insulating layer covering the unit cell wiring with necessary electrical connections to the unit cell wiring through contact holes being formed in the insulating layer.

In still another aspect of the invention, a layer of the pad relocation wiring for electrically replacing defective cells with good cells according to the technique (C) is formed of the foregoing first type of conductive material, and a layer of the inter-cell wiring is formed of the mentioned second type of conductive material. An erroneous or defective inter-cell wiring, if found to be present, is etched away by the use of the mentioned etching solution without producing an adverse affect on the pad relocation wiring, and thereafter inter-cell wiring is formed again by the use of the second type of conductive material or other suitable conductive material.

A fourth feature of the invention is in that, after examination of the electrical characteristics of the unit cells, an area of the wafer on which the inter-cell wiring according to the technique (B) or pad relocation wiring and inter-cell wiring according to the technique (C) is formed to constitute an LSI circuit is determined by the distribution of good unit cells on the wafer. In other words, a region of the wafer to be used as an LSI circuit chip (i.e., the region where the inter-cell wiring is installed) is determined so that the degree of change in inter-cell wiring pattern for interconnecting the good unit cells examined from the optimum inter-cell wiring pattern in the case where no defective cells are present is minimized and the shape of such inter-cell pattern is most simplified, or so that the amount and the shape of the pad relocation wiring are minimized and most simplified, respectively.

According to a fifth feature of the invention, a photomask for use in the formation of the pad relocation wiring in the technique (C) is made by the synthesis of a fixed mask-pattern for connection of terminals of the unit cell wiring on each unit cell with terminals for the inter-cell wiring, a mask-pattern for disconnecting terminals of the unit cell wiring of defective cells from the terminals for the inter-cell wiring, and a mask pattern for connecting the inter-cell wiring terminals separated from the defective cells to the unit cell wiring terminals of good cells which are to be electrically substituted for the mentioned defective cells.

In short, the invention makes the following advantages available.

(1) The use of test pads permits a unit cell to be electrically tested without the need for increasing the area of the unit cell. Because the area of a unit cell remains minimum, the degree of circuit integration can be increased and higher yield can be realized.

(2) The unit cell wiring layer is formed of a hard and corrosion-resistant material and the test pad is formed of a soft material of low corrosion-resistance. Since the test pad is soft, pressure or shock caused by a test probe which is brought into contact with the test pad for electrically testing the unit cell is absorbed by the test pad. Furthermore, because the unit cell wiring layer is of a hard material, this layer is hardly deformed by such external force and maintains mechanical stability. Still further, because the unit cell wiring layer is highly resistant to corrosion and the test pad is of low corrosion-resistance, the test pad can readily be etched away without affecting the unit cell wiring layer in the etching process.

(3) By using a soft conductive material of low corrosion-resistance for the inter-cell wiring and a hard, corrosion-resistant material for the pad-relocation wiring, it becomes possible, when defect or error is found in an inter-cell wiring, to remove the inter-cell wiring formed of the low corrosion-resistant material by etching without chemically affecting the unit cell wiring and the pad relocation wiring which are highly corrosion-resistant and to form an inter-cell wiring again. This facilitates enhancing the production yield of LSI wafers.

(4) By virtue of the abovementioned fourth feature of the invention, the degree of modification of the inter-cell wiring for avoiding defective cells is reduced in the process by the technique (B), and pad relocation wiring is decreased in the process by the technique (C), thereby resulting in a simplification of manufacturing process and in an increase in productivity.

(5) By virtue of the abovementioned fifth feature, the modification pattern for the pad relocation wiring in the technique (C) can be simplified and readily formed, thereby to permit the manufacturing process to be simplified and productivity to be increased.

The features and advantages of the invention will become more apparent from the following description of preferred embodiments, taken in connection with accompanying drawings, wherein:

FIG. 1 is a block diagram showing steps for fabricating LSI circuits according to the discretionary wiring technique, FIG. 2 is a block diagram showing steps for fabricating LSI circuits according to the pad relocation wiring technique, FIGS. 3 to 8 schematically illustrate an embodiment of the invention in which:

FIGS. 3(A) to 8(A) are a sequence of plan views of part of a semiconductor LSI circuit including unit cells in various stages of fabrication, and FIGS. 3(B) to 8(B) are cross-sectional views taken along respective lines B—B' of FIGS. 3(A) to 8(A).

FIG. 9 is a circuit diagram of a TTL logic gate circuit used as the circuit cell in the embodiment shown in FIGS. 3 to 8, FIGS. 10(A) to 14(A) are a sequence of plan views of part of a LSI circuit including unit cells of FIG. 9 in various stages of fabrication which illustrate another embodiment of the invention, FIGS. 10(B) to 14(B) are cross-sectional views taken along the respective lines B—B' of FIGS. 10(A) to 14(A), FIG. 15 is a plan view showing another method for installing unit cell test pads, FIGS. 16(A) to 16(C) are diagrams for illustrating how to determine the position of a pattern mask for inter-cell wiring according to the invention, and FIG. 17 schematically illustrates a method of making pad relocation wiring by use of a standard pattern and a modifying pattern according to the invention, in which;

Figure 9:
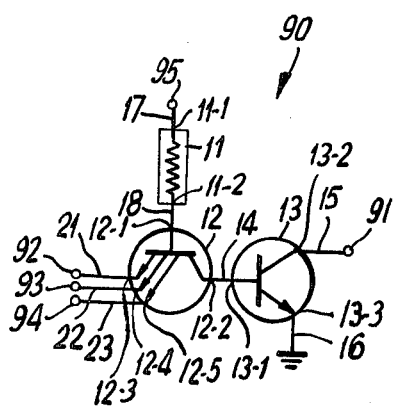

With reference to FIGS. 3 to 9, an LSI circuit, which is to be fabricated according to an embodiment of the invention, includes a plurality of unit cells X, Y and Z. Each unit cell is a 3-input TTL gate circuit 90 which consist of, as shown in FIG. 9; an NPN-type, multi-emitter, gate transistor 12 having a base 12-1, a collector 12-2, and three emitters 12-3, 12-4 and 12-5; an NPN-type inverter transistor 13 having a base 13-1 connected to the collector 12-2 of the gate transistor 12 by a conductor 14, a collector 13-2 connected to an output terminal 91 by a conductor 15, and an emitter 13-3 connected to the ground by a conductor 16; and a load resistor 11 with electrodes 11-1 and 11-2 connected respectively to a current supply terminal 95 through a conductor 17 and to the base 12-1 of the gate transistor 12 through a conductor 18. The three emitters 12-3, 12-4 and 12-5 of the gate transistor 12 are respectively connected to input terminals 92, 93 and 94 through conductors 21, 22 and 23. The terminals 91 to 95 of gate circuit 90 correspond to unit cell terminals, and the conductors 14 to 18 and 21 to 23 connecting the electrodes of the circuit elements 11 to 13 to each other or to the terminals 91 to 95 are unit cell wirings. In FIGS. 3 to 8, parts or portions equivalent to these of the circuit shown in FIG. 9 are indicated by the same reference numerals as those in FIG. 9.

Figures 1, 2:
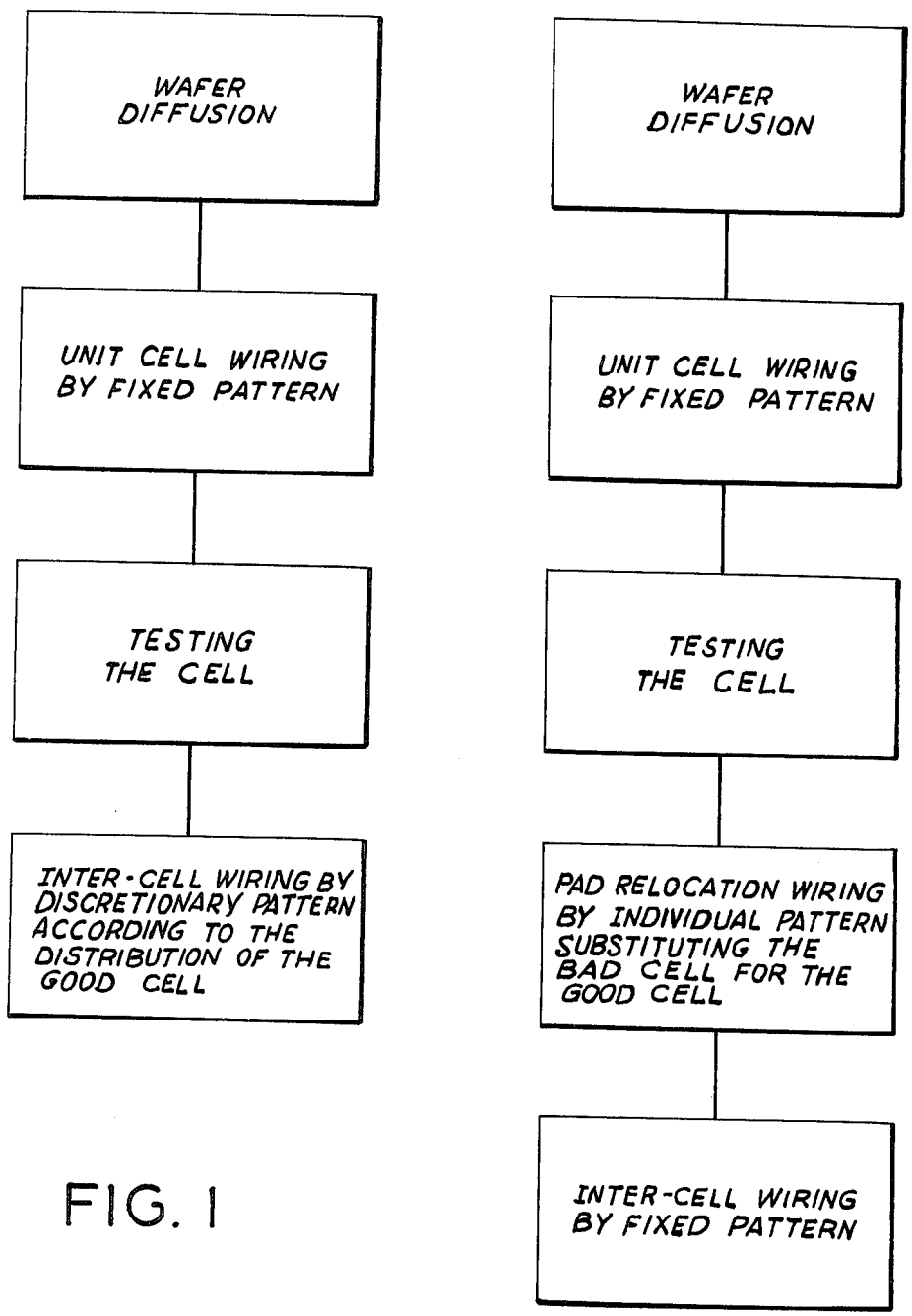
Figure 5A:
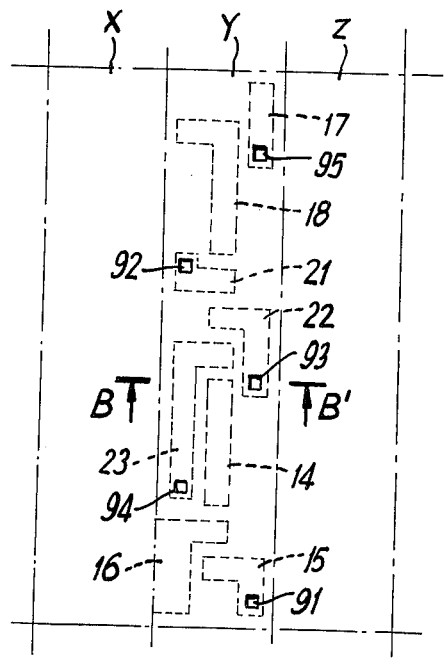
Figure 5B:
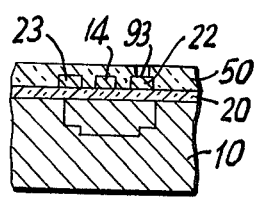

In this embodiment, the unit cells X and Y are intended to be used in the LSI circuit where they have no defect, whereas the unit cell Z is provided as a reserve. First, as shown in FIGS. 3(A) and 3(B), a load resistor 11, a gate transistor 12, and an inverter transistor of the unit cell circuit 90 are formed in each unit cell area in a semiconductor substrate 10, by the known technique of semiconductor integrated circuit fabrication. Openings are formed in an insulating film 20 covering the surface of the substrate 10 to expose the electrode portions 11-1, 11-2, 12-1 to 12-5, and 13-1 to 13-3 of the elements 11 to 13 formed in the substrate. Another openings 31 is also formed in the insulating film 20 to allow an electric connection to the substrate 10 of a ground potential. A platinum silicide layer 40 is formed on each of the exposed electrode portions in the openings in order to provide a good ohmic contact. These and the following processes are done by known techniques of fabricating semiconductor integrated circuits. Then, as shown in FIGS. 4(A) and 4(B), the unit cell wirings 15 to 18 and 21 to 23 of a 0.2 μm thick tantalum film are formed by the use of a fixed wiring pattern, preferably in the following manner. The substrate surface is coated with a photoresist, which is then selectively removed from the portion where the unit cell wirings are intended to be formed. A thin tantalum film is deposited over the entire surface of the substrate. The substrate surface is then subjected to photoresist removing process whereby the tantalum film on the photoresist is removed together with the photoresist. As a result, only the tantalum film in direct contact with the substrate surface remains unremoved whereby the unit cell wirings 15 to 18 and 21 to 23 connected to the exposed electrode portions through the openings in the insulating film 20 and extending to the surface of the insulating film 20 are formed. Then, as shown in FIGS. 5(A) and 5(B), a second insulating film 50 of a 0.5 μm thick silicon dioxide is deposited by a known vapor growth technique over the entire substrate surface to cover the unit cell wirings 17 to 18 and 21 to 23. Then, openings are formed in the second insulating film 50 to expose respective portions 91, 92, 93, 94 and 95 of the unit wirings 15, 21, 22, 23 and 17. The exposed portions 91 to 95 correspond to the unit cell terminals. By depositing an aluminum film of 2 μm in thickness over the second insulating film 50 with openings and then selectively etching it, test pads 91a to 95a of aluminum are formed on the second insulating film 50 with the respective through-hole connection of aluminum connecting the test pads 91a 95a to the terminals 91 to 95, respectively, through the openings in the second insulating film 50. Thus, all the terminals 91 to 95 of the unit cell circuit 90 are connected to the test pads 91a to 95a, and the emitter 13-3 of the inverter transistor 13 in the unit cell circuit 90 is connected through the unit cell wiring 16 and opening 31 to the substrate 10. Therefore, the electrical characteristics of each unit cell X, Y, Z can be measured by contacting probes with the test pads 91a to 95a with the substrate being connected to the ground. Because the test pads 91a to 95a are of aluminum which is a soft metal and the insulating films 50 and 20 and the unit cell wirings 14 to 18 and 21 to 23 underneath the test pads are of hard materials, pressure caused by the probes during test is absorbed by the aluminum pads and does not damage the insulating films and the unit cell wirings. The test pads and the through-hole connections are removed after the unit cells are tested. In removing the test pads and the through-hole connections, the use of a phosphoric acid solution at a temperature of 80° C is favorable. Phosphoric acid dissolves aluminum but does not dissolve silicon dioxide and tantalum, and its use permits the test pads and the through-hole connections to be removed without damaging the second insulating film 50 and the unit cell wirings 14 to 18 and 21 to 23.

Now, it is assumed that the test reveals the unit cell X to be defective and the unit cells Y and Z to be good. As shown in FIGS. 7(A) and 7(B), a 0.2 μm thick tantalum film is deposited over the second insulating film 50 with the openings therein and selectively removed to form pad relocation wirings 91c to 95c and wirings 91b to 95b for connection of the circuit cell terminals 91 to 95 of the good cell Y with terminals for inter-cell wirings. A pattern of the pad relocation wirings 91c to 95c is specially determined so as to substitute the good, auxiliary cell Z for the cell X which is intended to be used but is found defective, and particularly to connect the unit cell terminals 91 to 95 of the good cell Z with respective terminals on the defective cell X for inter-cell wirings. Then, as shown in FIGS. 8(A) and 8(B), a third insulating film 51 of 0.5 μm thick silicon dioxide is deposited over the substrate surface including the second-layer wirings 91b to 95b to 91c to 95c, and openings are formed in the third insulating film 51 to expose respective portions 91d to 95d of the pad relocation wirings 91c to 95c and of the terminal-connection wirings 91b to 95b. The portions 91d to 95d thus exposed serve as terminals for inter-cell wirings, which terminals are connected to all good cells. Finally, inter-connection between the good unit cells is made by forming inter-cell wirings of a fixed pattern (not shown) on the third insulating film 51 with necessary electric connections through the openings in the third insulating film to the terminals 91d to 95d, whereby an LSI circuit is built on the semiconductor substrate 10. The use of aluminum is favorable for the inter-cell wirings, because erroneous or defective inter-cell wiring of aluminum can readily be removed by an etching solution, such as phosphoric acid solution, to permit good wiring to be again formed in place of the bad one.

The invention has been described in connection with the an embodiment in which tantalum is used as the hard conductive material to form the unit cell wirings and the pad relocation wirings. As previously described, other materials such as titanium, tungsten and silicon may be used instead of tantalum. These materials will not be affected by phosphoric acid during the etching of aluminum used as the soft conductive material. An example where silicon is used as the hard conductive material will be described.

Figure 10A:
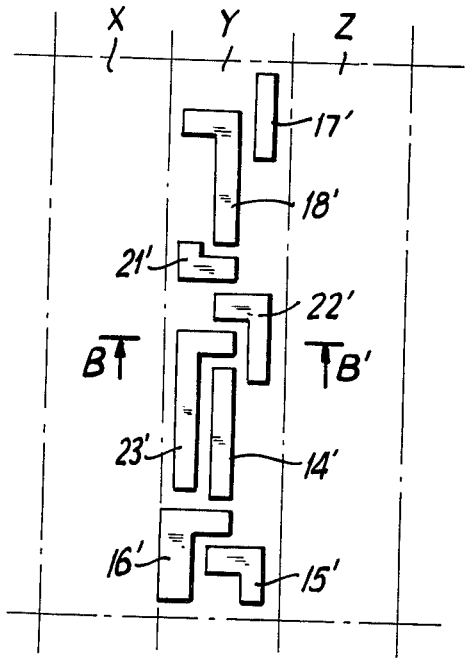
Figure 10B:
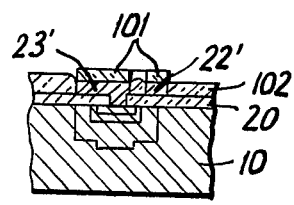
Figure 13A:
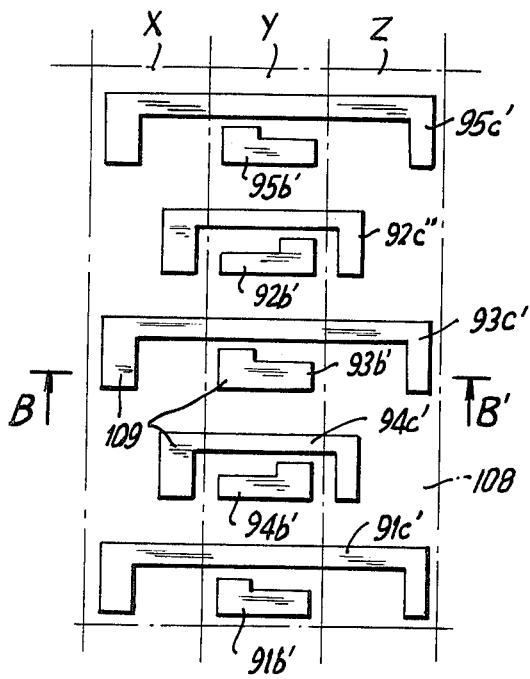
Figure 14A:
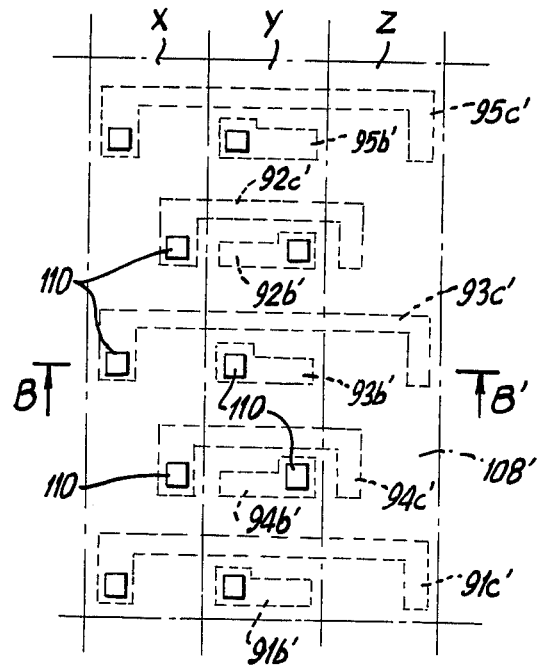
Figure 13B:
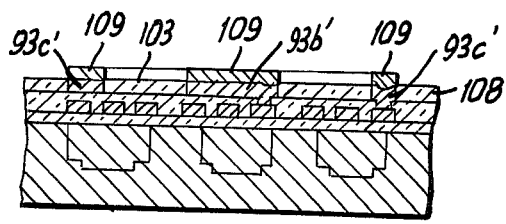
Figure 14B:
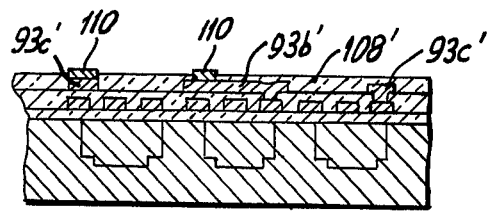

A silicon film or preferably polycrystalline silicon film may be selectively formed on the substrate simply in place of the tantalum wirings 14 to 18, 21 to 23, 91b to 95b and 91c to 95c shown in FIGS. 4 and 7. Alternatively, silicon wirings may be formed in another manner. At first, a silicon thin film is deposited uniformly on the silicon dioxide insulating film 20 having the openings shown in FIG. 3 (in this example, however, platinum silicide layer 40 is not needed.). Then, as shown in FIG. 10, a silicon nitride film 101 or another oxidation-barrier film is selectively formed on the silicon thin film to cover the surface of those portions of the silicon film which are intended to be unit cell wirings, and the uncovered portion of the silicon film is thermally oxidized throughout its entire thickness into silicon dioxide insulating film 102 by using the silicon nitride film 101 as a mask. The non-oxidized silicon portions 14' to 18' and 21' to 23' are used as the unit cell wirings. Then, as illustrated in FIG. 11, the silicon nitride film 101 is removed and another silicon nitride film 105 is formed on the portions of the unit cell wirings where unit cell terminals are intended, followed by a thermal oxidation of the exposed surface of the unit cell wirings 14' to 18' and 21' to 23' of silicon in part of its thickness into an insulating film 103 which corresponds to the second insulating film 50 in FIGS. 5 to 8. Then the silicon nitride film 105 is removed, and as illustrated in FIG. 12, test pads 91a to 95a of aluminum are formed to examine the unit cells, and then the test pads are removed by the use of phosphoric acid at a temperature of 80° C in the manner as described previously. After this step, as illustrated in FIG. 13, a silicon thin film is newly formed on the insulating film 103 and then the silicon thin film is selectively converted into insulating film 108 by thermal oxidation using silicon nitride film 109 as a mask. Thus pad relocation wirings 91c' to 95c' and terminal-connection wirings 91b' to 95b' are formed by utilizing the non-oxidized portions of the silicon thin film provided in the foregoing manner. Then, as illustrated in FIG. 14, the silicon nitride film 109 is removed, and terminal regions for the inter-cell wirings are covered with silicon nitride film 110, and silicon dioxide film 108' is formed on the exposed surface of the silicon wirings except at the terminal regions by thermal oxidation in part of its thickness. And then, the silicon nitride film 110 is removed and the inter-cell wirings (not shown) is formed by using fixed wiring pattern on the insulating film 108'. Thus, according to the invention, the silicon thin film is selectively converted into an insulating layer, the surface of the silicon thin film is made nearly flat, and hence the wiring layers formed on the silicon thin film can remain flat, with the results that device reliability is increased, productivity is improved, circuit integration is increased, and the formation of multi-layer wiring is simplified.

Figure 6A:
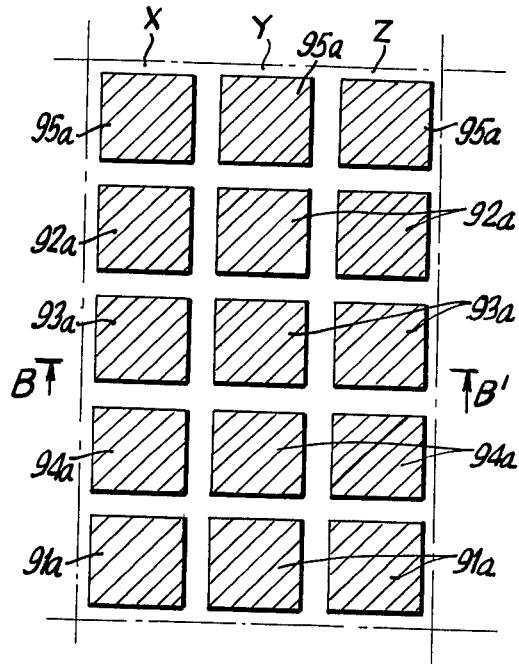
Figure 6B:
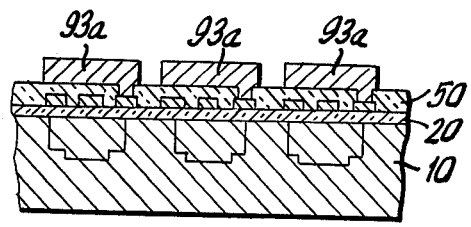
Figure 15:
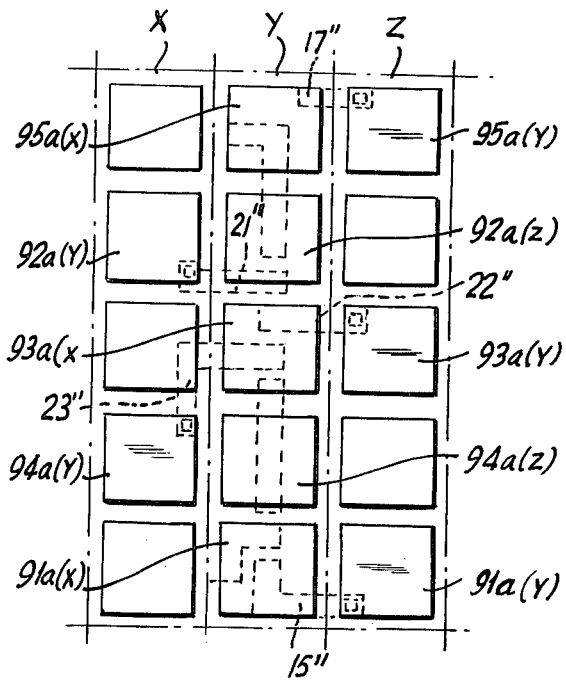

A desirable variation of the step of forming the test pads will be described with reference to FIG. 15. In the previously described embodiment, all the test pads 91a to 95a of each cell (e.g. of the cell Y) are disposed on the same cell (Y), as shown in FIGS. 6 and 12. However, it is favorable to dispose the test pads of one cell on other cells and arrange them in such manner that the neighboring test pads be positioned apart from each other. One example of such arrangement is shown in FIG. 15, in which the test pads 92a(Y) and 94a(Y) of the cell Y are formed on the region of the cell X and the remaining test pads 95a(Y), 93a(Y) and 91a(Y) of the cell Y are formed on the region of the cell Z. In other words, the test pads of the cell Y are arranged alternatively on the right-hand side cell Z and on the left-hand side cell X. For this purpose, the unit cell wirings 15, 17, 21, 22 and 23 of FIG. 4 connecting the electrodes of the elements 11, 12 and 13 to the respective unit cell terminals are modified as shown by reference numerals 15', 17', 21', 22', and 23', respectively, in FIG. 15. In the same manner, the test pads 95a(X), 93a(X) and 91a(X) of the cell X are formed on the region of its right-hand side cell Y, and the test pads 92a(Z) and 94a(Z) of the cell Z are formed on the region of its left-hand side cell Y. This method of arranging the test pads is also applied to the test pads of all the cells (not shown in the figure) other than the cells X, Y and Z, similarly. According to this arrangement of the test pads, contact of the probes of a testing apparatus with the test pads becomes easy and free of errors, because the distance between the adjacent probes is made larger owing to the large distance between the adjacent test pads. Thus, the test of the unit cells can be done with ease and high reliability.

Figure 16A:
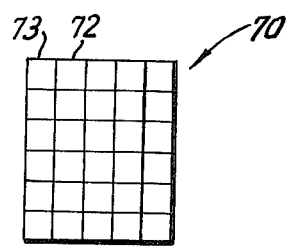
Figure 16B:
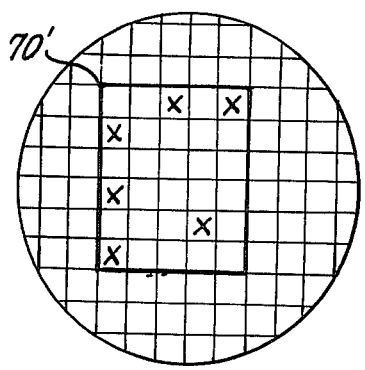
Figure 16C:
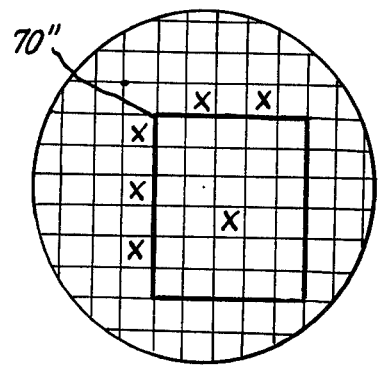

Another important feature of the invention lies in methods of minimizing the number of patterns to be changed per each wafer and thereby enhancing economy in the production of LSI circuits. According to one method thereof, which is mentioned above as the fourth feature of the invention, the position of an area for inter-cell wirings for use as an LSI chip on a wafer is determined in such manner that the number of bad unit cells is minimum in that area. This method will be described with reference to FIG. 16. Assume that an LSI chip 70 comprises 6 × 5 unit cells in which three lines of unit cells 73 are intended to be used and the remaining two lines of unit cells 72 are provided as auxiliary cells, as shown in FIG. 16(A), and that there are six bad unit cells in a wafer as marked by X in FIGS. 16(B) and (C). If an area 70', as in FIG. 16(B), is assigned to the inter-cell wiring pattern, that is, to the LSI chip, the number of bad cells is six and the number of cells to be avoided or replaced is five. While an area 70'' is assigned to the LSI chip, as in FIG. 16(C), the number of cells to be avoided or replaced is one. In other words, on an LSI circuit with an array of unit cells, the reference point of the inter-cell wiring fixed-pattern is moved up or down, or left or right, to find out the position where the number of bad cells is minimum and to minimize pad relocation wiring according to the positions of bad cells detected. The best reference point can be determined by examining the number of patterns to be changed according to the positioning of the reference point on the cell array and by choosing the position where the number of patterns to be changed is minimum. This approach makes it possible to reduce the number of patterns to be changed per each wafer. Furthermore, in the process by the discretionary technique (B), the inter-cell wiring pattern can be located at an adequate position where the number of inter-cell wirings to be changed due to defective cells is minimized.

Figure 17A:
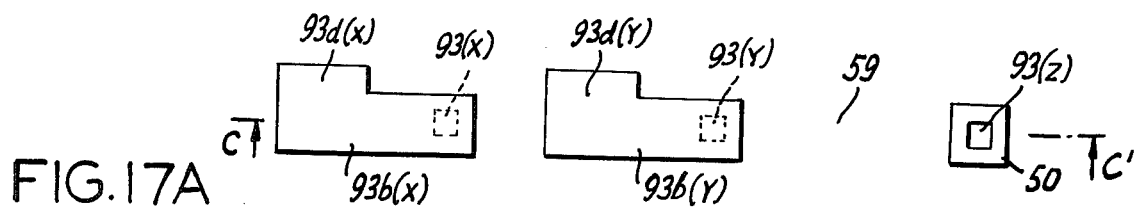
FIG. 17(A) shows a part of the standard pattern for pad location to be used where no pad relocation wiring is necessary.
Figure 17B:
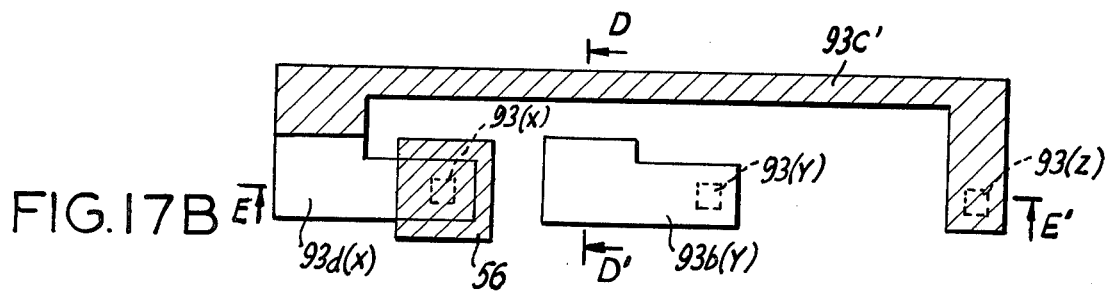
FIG. 17(B) shows a pad relocation pattern made by adding a modifying pattern to the standard pattern.
Figure 17C:
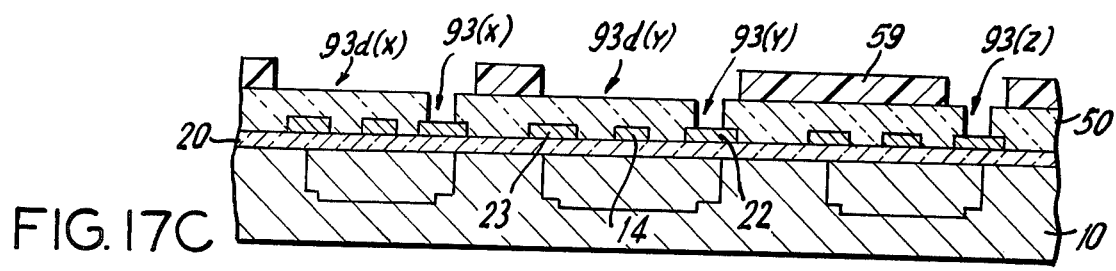
FIG. 17(C) is a cross-sectional view taken along the line C—C' of FIG. 17(A)
Figure 17D:
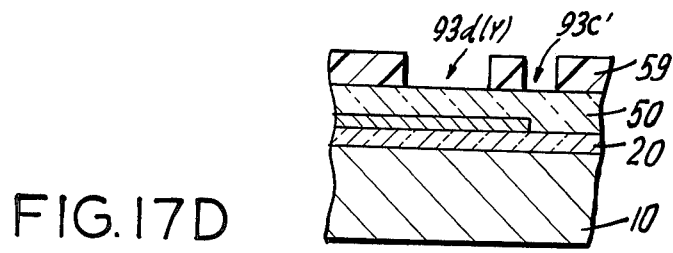
FIG. 17(D) is a cross-sectional view taken along the line D—D' of FIG. 17(D) and FIG. 17(E) is a cross-sectional view taken along the line E—E' of FIG. 17(B).
Figure 17E:
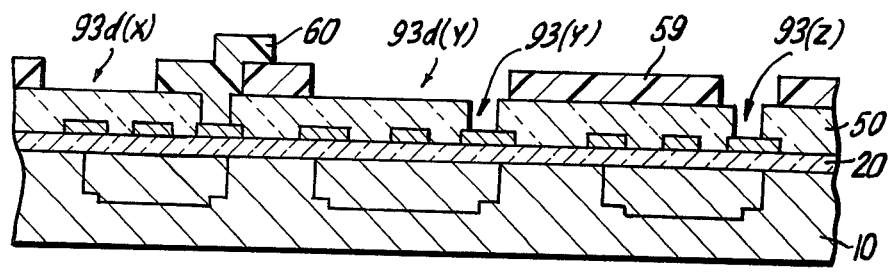

Another method of minimizing the number of patterns to be changed per each wafer, which is mentioned above as the fifth feature of the invention, will be described with reference to FIG. 17, wherein pad relocation wiring by the technique (C) is made by the use of a photomask. This is a favorable method for forming the pad relocation wirings shown in FIG. 7 and FIG. 8, and the explanation to be mentioned below stands on an assumption that the method is applied to the step illustrated in FIG. 7 and FIG. 8. Thus, each of lines C–C' and E–E' corresponds to the line B–B' of FIG. 7 before the pad relocation wirings 91c to 95c and the terminal interconnection wirings 91b to 95b are formed. In FIG. 17(A), areas for the inter-cell wiring terminal 93d(X) and 93d(Y) are respectively assigned to the inter-cell wiring terminals 93d of the cell X and cell Y, and areas for terminal interconnection wirings 93b(X) and 93b(Y) are assigned to the wirings connecting the terminals 93d of the cells X and Y, respectively. On the auxiliary cell Z, there is no area assigned to the inter-cell wiring terminal to be connected to the unit cell terminal 93 of the auxiliary cell Z. In the mentioned assumption that the cell X is defective and hence the unit cell terminal 93(X) of this cell X becomes impracticable, a pad relocation wiring must be done from the terminal 93(Z) of the auxiliary cell Z to the inter-cell wiring terminal 93d(X) of the bad cell X and the unit cell terminal 93(X) of the bad cell X must be disconnected from the inter-cell wiring terminal 93d(X) thereof. According to this method, three kinds of photomasks are used: one serves as a standard pattern for the inter-cell wiring terminals 93d, terminal interconnection wirings 93b and unit cell terminals 93, as shown in FIG. 17(A), another is an additional modifying pattern 93c' for pad relocation wiring, as in FIG. 17(B), and the rest is another additional modifying pattern 56, as in FIG. 17(B), for disconnecting the defective cell terminal from the inter-cell wiring terminal. FIGS. 17(A) and (C) shows the state that a photoresist 59 remains on an oxide film 50 on a silicon substrate 10 to expose the mentioned terminals 93 and 93d and wirings 93b, as the result of a process using a positive photoresist and by use of the photomask of the standard pattern. In FIG. 12(C), areas where the terminals 93 and 93d and wirings 93b are to be formed are indicated by these numerals with arrows. As shown in FIGS. 17(B) and (D), the additional modifying pattern 93c' is made by the use of positive photoresist 59, in which an area 93c' for the intended pad relocation wiring is exposed. Then, as shown in FIGS. 17(B) and 17(E), the terminal 93(X) is disconnected by the use of a negative photoresist 60 and the photomask defining the defective cell disconnecting pattern 56. FIG. 17(E) shows the state that the photoresist 60 has been formed. On the photoresists 59 and 60 of the three patterns exposing the necessary terminal and wiring areas, a thin tantalum film is deposited. Then, the photoresist 59 and 60 are removed together with portions of the tantalum film which lie on the photoresist 59 and 60 to leave and thereby form the terminals 93, 93d and wirings 93b, 93c shown in FIG. 7.

Thus, according to this method, a pad relocation LSI chip can be realized by a single step of pattern modification, and the number of patterns to be changed per wafer is reduced by the use of a standard pattern and a modifying pattern which are provided from the pattern used in the pad relocation.

What is claimed is:

1. A method of fabricating a large-scale semiconductor integrated circuit device comprising the steps of forming a plurality of circuit elements in a semiconductor substrate, forming a first insulating layer having openings therein on the main surface of said substrate, forming a first layer of unit cell wirings which are connected electrically to the elements through said openings in said first insulating layer, forming a second insulating layer having openings therein and covering said first layer of unit cell wirings, forming on said second insulating layer test pads connected electrically to predetermined portions of said unit cell wirings through the openings in said second insulating layer, testing the unit cells by using said test pads, removing all of said test pads from the surface of said second insulating layer after said testing step, and forming on said second insulating layer a second layer of wirings connected to said unit cell wirings through the openings in said second insulating layer.

2. The method of claim 1, wherein said step of forming a second layer of wirings includes the step of forming a second layer of inter-cell wirings in said second insulating layer which are connected to the unit cell wirings of good unit cells through said openings in said second insulating layer, after said removing step.

3. The method of claim 1, further comprising the steps of forming a second layer of pad relocation wirings on said second insulating layer after said removing step which wirings are connected to said inter-cell wirings of at least one selected good unit cell and arranged to electrically replace a bad unit cell by said selected good unit cell, forming a third insulating lyaer having openings therein and covering said second layer of pad relocation wirings, and forming a third layer of inter-cell wirings on said third insulating layer which interconnect good unit cells.

4. The method of claim 1, wherein said first layer of unit cell wirings is formed of a conductive material selected from the group of tantalum, tungsten, titanium, platinum and silicon.

5. The method of claim 4, wherein said test pads are formed of aluminum.

6. The method of claim 3, in which said first and second wiring layers are formed of a material selected from the group of tantalum, tungsten, titanium, platinum and silicon, and said test pads and said third wiring layer are formed of aluminum.

7. The method of claim 2, further comprising the step of assigning said inter-cell wirings to an area of said substrate where the number of bad unit cells is minimum.

8. The method of claim 3, further comprising the step of assigning said pad relocation wirings and said inter-cell wirings to an area of said substrate where the number of bad unit cell is minimum.

9. The method of claim 3, further comprising the step of forming terminals for said inter-cell wirings on said second insulating layer which are connected to the predetermined portions of the unit cell wirings of other selected good unit cells through the openings in said second insulating layer.

10. The method of claim 9, in which said step of forming the second layer of pad relocation wirings includes making a photomask for said relocation wirings by combining a standard pattern for connection of the predetermined portions of the unit cell wirings to terminals for inter-cell wirings with a modification pattern for avoiding a bad unit cell.

11. A method of fabricating a large-scale semiconductor integrated circuit device comprising the steps of forming a plurality of circuit elements in a semiconductor substrate, forming a first insulating layer having openings therein on the main surface of said substrate, forming a first layer of unit cell wiring connected electrically to said elements through said openings in said first insulating layer, forming a second insulating layer having openings therein and covering said first layer of unit cell wiring, forming on said second insulating layer test pads of a metal which is different than the metal of said first layer of unit cell wiring, said test pads being connected electrically to predetermined portions of said unit cell wiring through the openings in said second insulating layer, testing the unit cells by using said test pads, and removing said test pads after said testing step by etching with an etchant that has substantially no effect on said unit cell wiring and said second insulating layer.

12. The method of claim 11, further comprising the step following said test pads removing step of forming a second layer of inter-cell wiring on said second insulating layer which are connected to said unit cell wiring of good unit cells through said openings in said second insulating layer.

13. The method of claim 12, further comprising the steps of forming a second layer of pad relocation wiring on said second insulating layer after said removing step which wiring are connected to said inter-cell wiring of at least one selected good unit cell and arranged to electrically replace a bad unit cell by said selected good unit cell, forming a third insulating layer having openings therein and covering said second layer of pad relocation wiring, and forming a third layer of inter-cell wiring on said third insulating layer which interconnect good unit cells.

14. The method of claim 11, wherein said first layer of unit cell wiring is formed of a conductive material selected from the group consisting of tantalum, tungsten, titanium, platinum and silicon.

15. The method of claim 14, wherein said test pads are formed of aluminum.

16. The method of claim 13, in which said first and second wiring layers are formed of a material selected from the group consisting of tantalum, tungsten, titanium, platinum andd silicon, and said test pads and said third wiring layer are formed of aluminum.

17. The method of claim 12, further comprising the step of assigning said inter-cell wiring to an area of said substrate where the number of bad unit cells is minimum.

18. The method of claim 13, further comprising the step of assigning said pad relocation wiring and said inter-cell wiring to an area of said substrate where the number of bad unit cells is minimum.

19. The method of claim 13, further comprising the step of forming terminals for said inter-cell wiring on said second insulating layer which are connected to the predetermined portions of the unit cell wiring of other selected good unit cells through the openings in said second insulating layer.

20. The method of claim 19, in which said step of forming the second layer of pad relocation wiring includes making a photomask for said relocation wiring by combining a standard pattern for the connection of the predetermined portions of the unit cell wiring to terminals for inter-cell wiring with a modification pattern for avoiding a bad unit cell.

* * * * *